US012787495B2

(12) United States Patent
Lin et al.

(10) Patent No.: US 12,787,495 B2
(45) Date of Patent: Nov. 3, 2026

(54) TRANSPARENT DISPLAY

(71) Applicant: INDUSTRIAL TECHNOLOGY RESEARCH INSTITUTE, Hsinchu (TW)

(72) Inventors: Yi-Chen Lin, Taipei City (TW); Yao-Jun Tsai, Hsinchu County (TW); Ming-Hsien Wu, Tainan City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 366 days.

(21) Appl. No.: 18/542,771

(22) Filed: Dec. 18, 2023

(65) Prior Publication Data

US 2024/0258456 A1 Aug. 1, 2024

Related U.S. Application Data

(60) Provisional application No. 63/482,302, filed on Jan. 31, 2023.

(30) Foreign Application Priority Data

Nov. 10, 2023 (TW) ................................ 112143533

(51) Int. Cl.
*H10H 20/81* (2025.01)
*H10H 20/852* (2025.01)
(Continued)

(52) U.S. Cl.
CPC .......... *H10H 20/81* (2025.01); *H10H 20/852* (2025.01); *H10H 20/857* (2025.01); *H10W 90/00* (2026.01)

(58) Field of Classification Search
CPC .... H10H 20/81; H10H 20/852; H10H 20/857; H10H 20/853; H10W 90/00
See application file for complete search history.

(56) References Cited

U.S. PATENT DOCUMENTS

2015/0176769 A1 6/2015 Lee
2020/0058625 A1* 2/2020 Chen .................. H10H 20/841
(Continued)

FOREIGN PATENT DOCUMENTS

CN 113571558 A 10/2021
CN 114050220 A 2/2022
(Continued)

OTHER PUBLICATIONS

The Office Action of TW112143533 mailed on Aug. 23, 2024.

*Primary Examiner* — Marlon T Fletcher
*Assistant Examiner* — Christina A Sylvia
(74) *Attorney, Agent, or Firm* — CKC & Partners Co., LLC

(57) ABSTRACT

A transparent display includes a transparent substrate, a wiring layer, a plurality of light-emitting package units, and a plurality of connecting elements. The wiring layer is disposed on a surface of the transparent substrate. Each of the light-emitting package units includes a micro-substrate, frontward light-emitting elements, backward light-emitting elements, and a sealant. The micro-substrate has a first surface facing away from the transparent substrate and a second surface facing the transparent substrate. The frontward light-emitting elements are disposed on the first surface of the micro-substrate, in which the micro-substrate is configured to block the light from the frontward light-emitting elements toward the transparent substrate. The backward light-emitting elements are disposed on the second surface of the micro-substrate. The sealant covers the micro-substrate, the frontward light-emitting elements, and the backward light-emitting elements. The connecting elements electrically connect the light-emitting package units to the wiring layer, respectively.

11 Claims, 19 Drawing Sheets

(51) Int. Cl.
*H10H 20/857* (2025.01)
*H10W 90/00* (2026.01)

(56) References Cited

U.S. PATENT DOCUMENTS

| | | | | |
|---|---|---|---|---|
| 2020/0235261 | A1* | 7/2020 | Hu | H10H 20/812 |
| 2021/0118855 | A1* | 4/2021 | Kusunoki | H10W 90/00 |
| 2021/0376187 | A1* | 12/2021 | Knisley | H10H 20/01 |
| 2021/0391381 | A1* | 12/2021 | Asada | H10H 20/8312 |
| 2023/0102042 | A1 | 3/2023 | Liao et al. | |
| 2023/0207743 | A1* | 6/2023 | Lee | H10H 20/8506<br>257/91 |

FOREIGN PATENT DOCUMENTS

| | | | |
|---|---|---|---|
| CN | 116096166 | A | 5/2023 |
| TW | 201126693 | A | 8/2011 |
| TW | I693708 | B | 5/2020 |
| TW | 202221916 | A | 6/2022 |
| TW | I790565 | B | 1/2023 |

* cited by examiner

TRANSPARENT DISPLAY

RELATED APPLICATIONS

This application claims priority to U.S. Provisional Application Ser. No. 63/482,302, filed Jan. 31, 2023, and Taiwan application Ser. No. 11/214,3533, filed Nov. 10, 2023, the disclosures of which are incorporated herein by reference in their entireties.

BACKGROUND

Field of Invention

The present disclosure relates to a transparent display. More particularly, the present disclosure relates to a transparent display having double-side display function.

Description of Related Art

Transparent displays are displays that users can see through the display and observe objects behind the transparent displays. More particularly, some of the transparent displays can provide double-side display function. That is, the transparent displays may have two display surfaces, opposite users not only can see the images provided by the front side display surface but also observe objects at the back side through the transparent displays.

The conventional double-side transparent displays generally provide images by two different display panels. However, the thickness of the double-side transparent displays including two display panels is increased, and the personal privacy and light transmittance thereof are also limited. Thus the utilizations of the transparent displays are reduced.

SUMMARY

According to some embodiments of the disclosure, a transparent display includes a transparent substrate, a wiring layer disposed on a surface of the transparent substrate, a plurality of light-emitting package units, a sealant, and a plurality of connecting elements. Each of the light-emitting package units includes a micro-substrate having a first surface facing away from the transparent substrate and a second surface facing the transparent substrate, a plurality of frontward light-emitting elements disposed on the first surface of the micro-substrate, and a plurality of backward light-emitting elements disposed on the second surface of the micro-substrate. The micro-substrate is configured to block a light from the frontward light-emitting elements toward the transparent substrate. The sealant covers the micro-substrate, the frontward light-emitting elements, and the backward light-emitting elements. The connecting elements electrically connect the light-emitting package units to the wiring layer, respectively.

According to some embodiments of the disclosure, a transparent display includes a transparent substrate, a wiring layer disposed on a surface of the transparent substrate, a plurality of frontward light-emitting package units, a and a plurality of backward light-emitting package units. Each of the frontward light-emitting package units includes a micro-substrate, a plurality of frontward light-emitting elements disposed on the micro-substrate, and a front side sealant covering the micro-substrate and the frontward light-emitting elements. The micro-substrate is configured to block a light from the frontward light-emitting elements toward the transparent substrate. Each of the backward light-emitting package units includes a micro-substrate, a plurality of backward light-emitting elements disposed on the micro-substrate, and a back side sealant covering the micro-substrate and the backward light-emitting elements.

The transparent display includes light-emitting package units having frontward light-emitting elements and backward light-emitting elements. The micro-substrate of each of the light-emitting package units is configured to block a light from the frontward light-emitting elements toward the transparent substrate. Similarly, the light emitted by the backward light-emitting elements toward the micro-substrate is also blocked by the micro-substrate. Thus the front side display contexts of the transparent display would not be observed by the back side user, and the back side display contexts of the transparent display would not be observed by the front side user. Therefore, the transparent display can achieve requirements of personal privacy and light transmittance while proving double-side display function. The light-emitting package units can be made and packaged and then be electrical tested. After the light-emitting package units pass the electrical test, the light-emitting package units can be mass transferred to the transparent substrate for assembling. The yield of the transparent display can be improved, and the defects or rework issues can be reduced accordingly.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
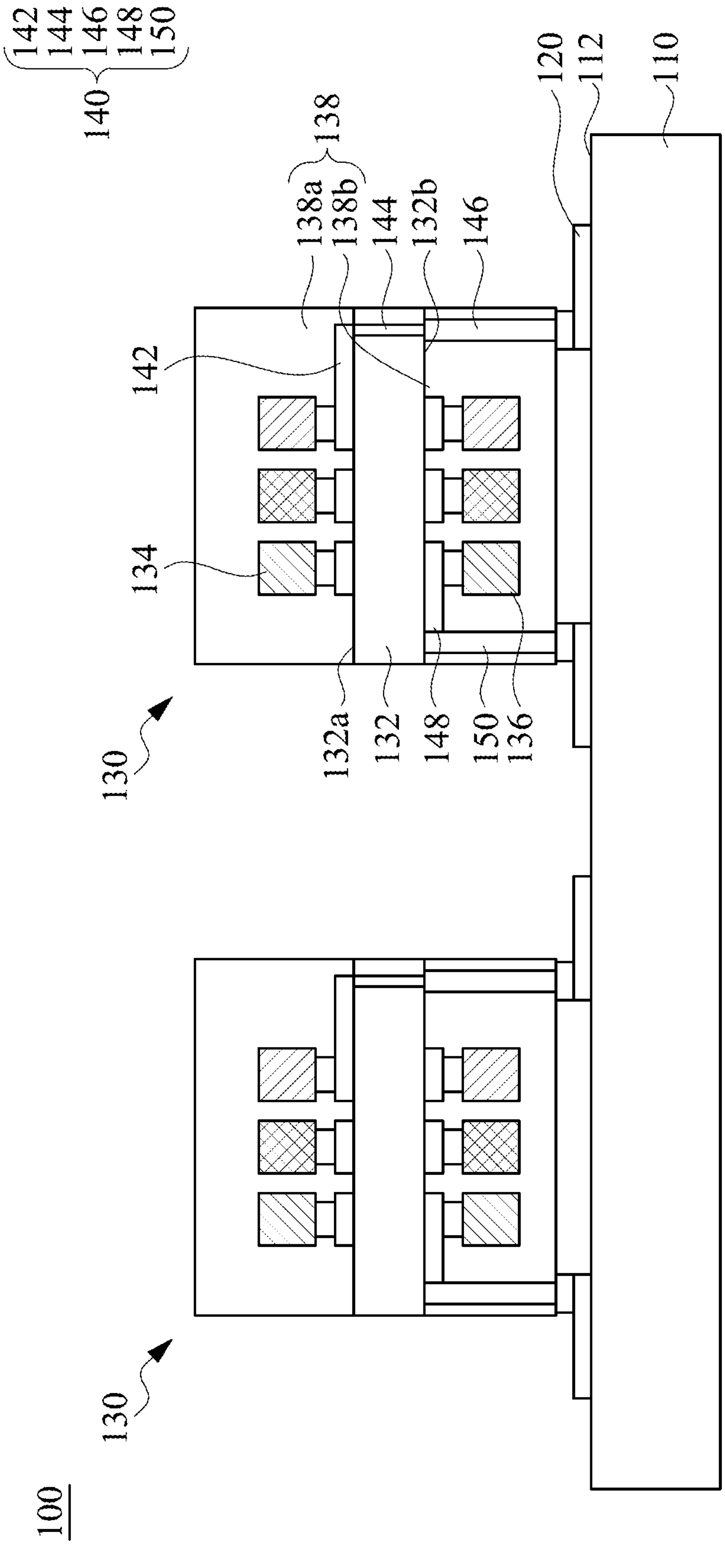
FIG. 1 is a partially cross-sectional view of a transparent display according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

The transparent displays provided by the disclosure are suitable for double-side display. The transparent displays provided by the disclosure further achieve requirements of personal privacy and light transmittance while proving double-side display function. Details of the transparent displays are discussed in the following embodiments.

Reference is made to FIG. 1, which is a partially cross-sectional view of a transparent display according to some embodiments of the disclosure. The transparent display 100 includes a transparent substrate 110, a wiring layer 120 disposed on a surface 112 of the transparent substrate 110, a plurality of light-emitting package units 130, and a plurality of connecting elements 140 to electrically connect the light-emitting package units 130 to the wiring layer 120, respectively. In some embodiments, all of the light-emitting package units 130 are disposed on the same surface 112 of the transparent substrate 110. Each of the light-emitting package units 130 includes a micro-substrate 132, a plurality of frontward light-emitting elements 134, a plurality of backward light-emitting elements 136, and a sealant 138.

The micro-substrate 132 has a first surface 132*a* facing away from the transparent substrate 110 and a second surface 132*b* facing the transparent substrate 110. The frontward light-emitting elements 134 are disposed on the first surface 132*a* of the transparent substrate 110, and the backward light-emitting elements 136 are disposed on the second surface 132*b* of the transparent substrate 110. The sealant 138 covers the micro-substrate 132, the frontward light-emitting elements 134, and the backward light-emitting elements 136.

The light transmittance of the transparent substrate 110 is greater than or equal to 90%. The micro-substrate 132 is a light-shielding substrate, in which the light transmittance of the micro-substrate 132 is less than or equal to 5%. The micro-substrate 132 is configured to block a light from the frontward light-emitting elements 134 toward the transparent substrate 110. Namely, the light emitted by the frontward light-emitting elements 134 is emitted from the first surface 132*a* of the micro-substrate 132 (hereafter as frontward) and is not emitted from the second surface 132*b* of the micro-substrate 132 (hereafter as backward). On the other hand, the light emitted by the backward light-emitting elements 136 toward the micro-substrate 132 is also blocked by the micro-substrate 132. Thus the light emitted by the backward light-emitting elements 136 is emitted backward of the micro-substrate 132, not frontward of the micro-substrate 132. Therefore, the front side display contexts of the transparent display 100 would not be observed by the back side user, and the back side display contexts of the transparent display 100 would not be observed by the front side user. Therefore, the transparent display 100 can achieve requirements of personal privacy and light transmittance while proving double-side display function.

In some embodiments, each of the connecting elements 140 includes a plurality of first connecting pads 142, a plurality of vias 144, and a plurality of first conductive pillars 146. The first connecting pads 142 are disposed on the first surface 132*a* of the micro-substrate 132 and are coupled to the corresponding frontward light-emitting elements 134. For example, the first connecting pads 142 are disposed on the first surface 132*a* of the micro-substrate 132 and are coupled to the electrodes of the corresponding frontward light-emitting elements 134 through solders.

The vias 144 penetrate the micro-substrate 132, and the vias 144 are coupled to the first connecting pads 142, respectively. The first conductive pillars 146 are configured to couple the vias 144 to the wiring layer 120 on the transparent substrate 110. As a result, the wiring layer 120 on the transparent substrate 110 is electrically coupled to the frontward light-emitting elements 134 via the first conductive pillars 146, the vias 144, and the first connecting pads 142.

In some embodiments, each of the connecting elements 140 further includes a plurality of second connecting pads 148 and a plurality of second conductive pillars 150. The second connecting pads 148 are disposed on the second surface 132*b* of the micro-substrate 132 and coupled to the backward light-emitting elements 136. For example, the second connecting pads 148 are disposed on the second surface 132*b* of the micro-substrate 132 and coupled to the electrodes of the corresponding backward light-emitting elements 136 through solders. The second conductive pillars 150 are disposed in the sealant 138. The second conductive pillars 150 are coupled to the second connecting pads 148 and are coupled to the wiring layer 120 on the transparent substrate 110 though solders. As a result, the wiring layer 120 on the transparent substrate 110 is electrically coupled to the backward light-emitting elements 136 via the second conductive pillars 150 and the second connecting pads 148.

In some embodiments, the wiring layer 120, the first connecting pads 142, the vias 144, the first conductive pillars 146, the second connecting pads 148, and the second conductive pillars 150 are made of conductive material such as metal including Cu, Al, Ag, or alloys thereof.

In some embodiments, in order to maintain the transmittance of the transparent display 100, the light-emitting package units 130 are spaced apart from each other for a predetermined distance such that the overall transmittance of the transparent display 100 is greater than 30%.

In some embodiments, the micro-substrate 132 is a silicon substrate, a ceramic substrate, or a printed circuit substrate. The frontward light-emitting elements 134 and the backward light-emitting elements 136 are active-type light-emitting elements such as mini LED or micro LED. In some embodiments, the material of the sealant 138 can be silicone, resin, or acrylic glue. In some embodiments, the side surface of the sealant 138 is substantially aligned with the side surface of the micro-substrate 132. The sealant 138 includes a first sealing portion 138*a* disposed on the first surface 132*a* of the micro-substrate 132 and a second sealing portion 138*b* disposed on the second surface 132*b* of the micro-substrate 132. The first sealing portion 138*a* seals the frontward light-emitting elements 134, the second sealing portion 138*b* seals the backward light-emitting elements 136, and the first sealing portion 138*a* and the second sealing portion 138*b* are spaced by the micro-substrate 132.

In some embodiments, the light transmittance of the first sealing portion 138*a* is same as a light transmittance of the second sealing portion 138*b*. In some embodiments, the light transmittance of the first sealing portion 138*a* is different from the light transmittance of the second sealing portion 138*b*. For example, the thickness of the first sealing portion 138*a* is different from the thickness of the second sealing portion 138*b*, or the material of the first sealing portion 138*a* is different from the material of the second sealing portion **138*b*, such that the light transmittance of the first sealing portion 138*a* is different from the light transmittance of the second sealing portion 138*b*. In some embodiments, depending on the operation environment, the light transmittance of the first sealing portion 138*a* and the light transmittance of the second sealing portion 138*b* can be adjusted to make the brightness of double-sides of the transparent display 100** more identical or more distinguishable.

Figure 2:
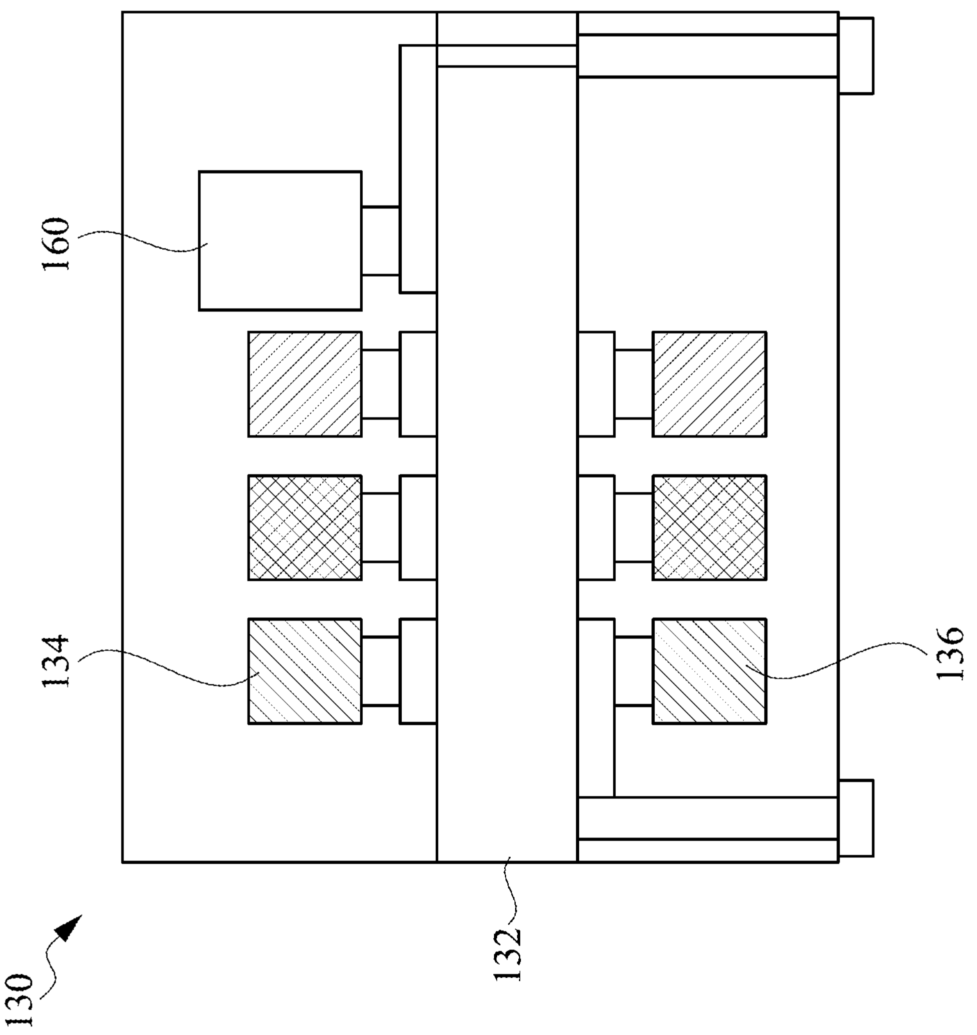
FIG. 2 and FIG. 3 are partially cross-sectional views of different embodiments of the light-emitting package unit of the transparent display of the disclosure.
Figure 3:
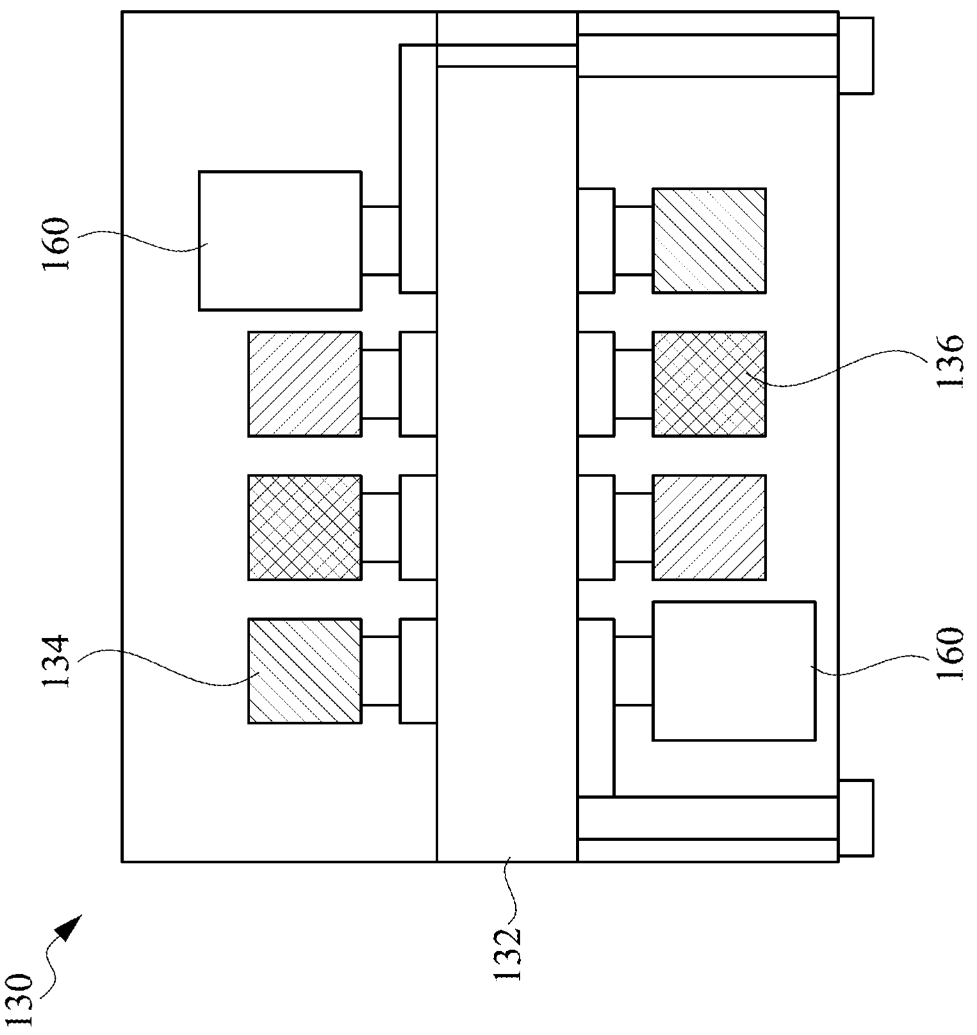

Reference is made to FIG. 2 and FIG. 3, which are partially cross-sectional views of different embodiments of the light-emitting package unit of the transparent display of the disclosure. Optionally, the light-emitting package unit 130 further includes a driving IC 160 disposed at one side of the micro-substrate 132 (FIG. 2) or two driving ICs 160 disposed at opposite sides of the micro-substrate 132 (FIG. 3). The one or more driving ICs 160 are coupled to the frontward light-emitting elements 134 and/or the backward light-emitting elements 136 and the wiring layer 120 (see FIG. 1). In some other embodiments, the driving IC 160 can be individually disposed on the transparent substrate 110 of FIG. 1 (the driving IC 160 is not illustrated in FIG. 1).

The aforementioned light-emitting package units 130 can be made and packaged and then be electrical tested. After the light-emitting package units 130 pass the electrical test, the light-emitting package units 130 can be mass transferred to the transparent substrate 110 for assembling. Because the light-emitting package units 130 are assembled to the transparent substrate 110 after passing the electrical test, the yield of the transparent display 100 can be improved, and the defects or rework issues can be reduced accordingly.

Figure 4:
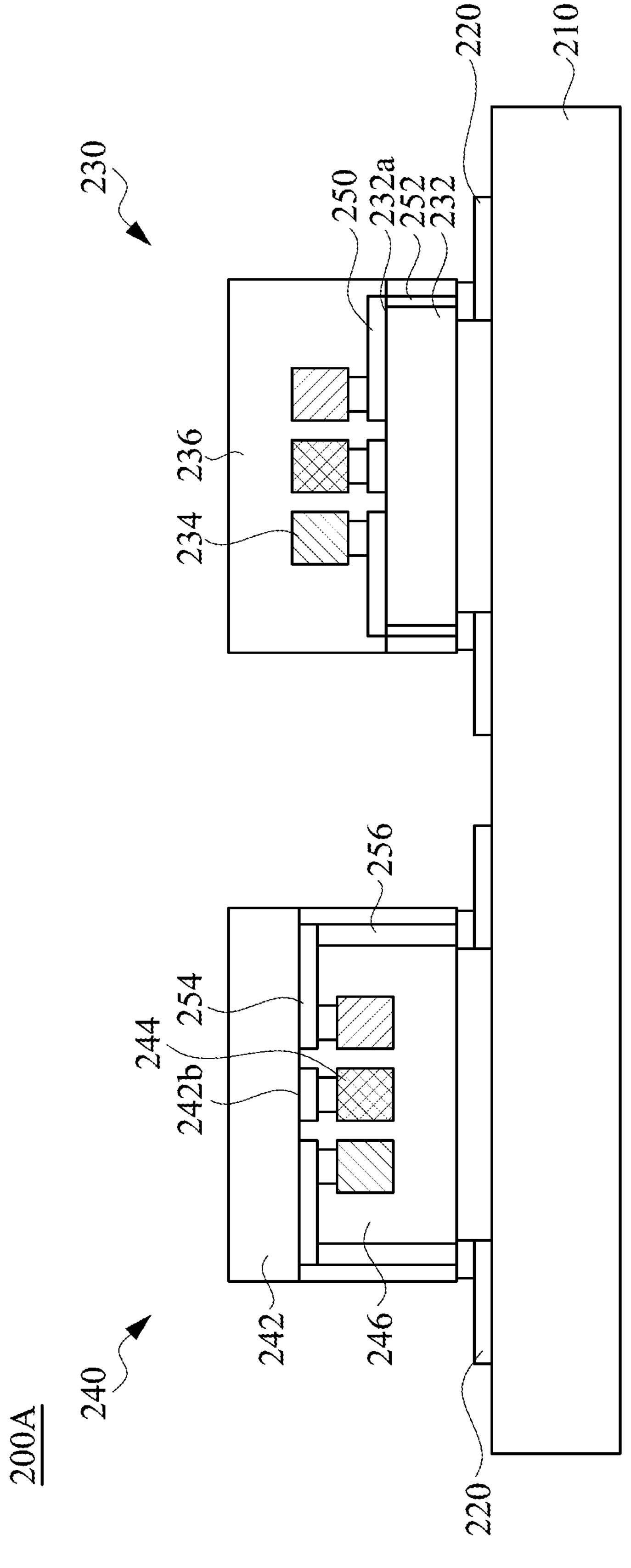
FIGS. 4, 5, 6, 7 are partially cross-sectional views of the transparent display according to different embodiments of the disclosure.

Reference is made to FIG. 4, which is a partially cross-sectional view of the transparent display according to some embodiments of the disclosure. The transparent display 200A includes a transparent substrate 210, a wiring layer 220 on a surface of the transparent substrate 210, a plurality of frontward light-emitting package units 230, and a plurality of backward light-emitting package units 240. The number of the frontward light-emitting package units 230 and the backward light-emitting package units 240 is simplified for better understanding. In some embodiments, the frontward light-emitting package units 230 and the backward light-emitting package units 240 are alternately arranged on the surface of the transparent substrate 210 and are spaced apart from each other. The frontward light-emitting package units 230 and the backward light-emitting package units 240 are coupled to the wiring layer 220.

In some embodiments, each of the frontward light-emitting package unit 230 includes a micro-substrate 232, a plurality of frontward light-emitting elements 234 disposed on the micro-substrate 232, and a front side sealant 236 covering the micro-substrate 232 and the frontward light-emitting elements 234. The light emitted by the frontward light-emitting elements 234 is mainly emitted in a direction away the transparent substrate 210 (e.g. frontward), and the micro-substrate 232 is configured to block the light emitted from the frontward light-emitting elements 234 toward the transparent substrate 210 (e.g. backward).

In some embodiments, each of the backward light-emitting package unit 240 includes a micro-substrate 242, a plurality of backward light-emitting elements 244 disposed on the micro-substrate 242, and a back side sealant 246 covering the micro-substrate 242 and the backward light-emitting elements 244. The light emitted by the backward light-emitting elements 244 is mainly emitted in a direction toward the transparent substrate 210 (e.g. backward), and the micro-substrate 242 is configured to block the light emitted from the backward light-emitting elements 244 away from the transparent substrate 210 (e.g. frontward).

Therefore, the front side display contexts of the transparent display 200A would not be observed by the back side user, and the back side display contexts of the transparent display 200A would not be observed by the front side user. Therefore, the transparent display 200A can achieve requirements of personal privacy and light transmittance while proving double-side display function.

In some embodiments, the frontward light-emitting package units 230 and the backward light-emitting package units 240 are disposed on the same surface of the transparent substrate 210. The frontward light-emitting package units 230 and the backward light-emitting package units 240 are spaced apart from each other for a predetermined distance such that the overall transmittance of the transparent display 200A is greater than 30%.

In some embodiments, the light transmittance of the transparent substrate 210 is greater than 90%. The micro-substrates 232, 242 can be a silicon substrate, a ceramic substrate, or a printed circuit board. The frontward light-emitting elements 234 and the backward light-emitting elements 244 are active-type light-emitting elements such as mini LED or micro LED. In some embodiments, the material of the front side sealant 236 and the back side sealant 246 can be silicone, resin, or acrylic glue, and the light transmittance of the front side sealant 236 can be the same or different from the light transmittance of the back side sealant 246. In some embodiments, one or more driving ICs can be optionally disposed in the frontward light-emitting package unit 230 and the backward light-emitting package unit 240.

In some embodiments, in order to electrically connect the frontward light-emitting package units 230 to the wiring layer 220, the transparent display 200A further includes a plurality of first connecting pads 250 and a plurality of vias 252. The first connecting pads 250 are disposed on the first surface **232*a* of the micro-substrate 232 of the frontward light-emitting package unit 230, in which the first surface 232*a* of the micro-substrate 232 is away from the transparent substrate 210. The first connecting pads 250 can be coupled to the electrodes of the frontward light-emitting elements 234 through solders. The vias 252 penetrate the micro-substrate 232 of the frontward light-emitting package unit 230, to couple to the first connecting pads 250 and to couple to the wiring layer 220 on the transparent substrate 210** through solders.

In some embodiments, in order to electrically connect the backward light-emitting package units 240 to the wiring layer 220, the transparent display 200A further includes a plurality of second connecting pads 254 and a plurality of conductive pillars 256. The second connecting pads 254 are disposed on the second surface **242*b* of the micro-substrate 242 of the backward light-emitting package unit 240, in which the second surface 242*b* of the micro-substrate 242 is facing the transparent substrate 210. The second connecting pads 254 can be coupled to the electrodes of the backward light-emitting elements 244 through solders. The conductive pillars 256 penetrate the back side sealant 246, to couple to the second connecting pads 254 and to couple to the wiring layer 220 on the transparent substrate 210** through solders.

Figure 5:
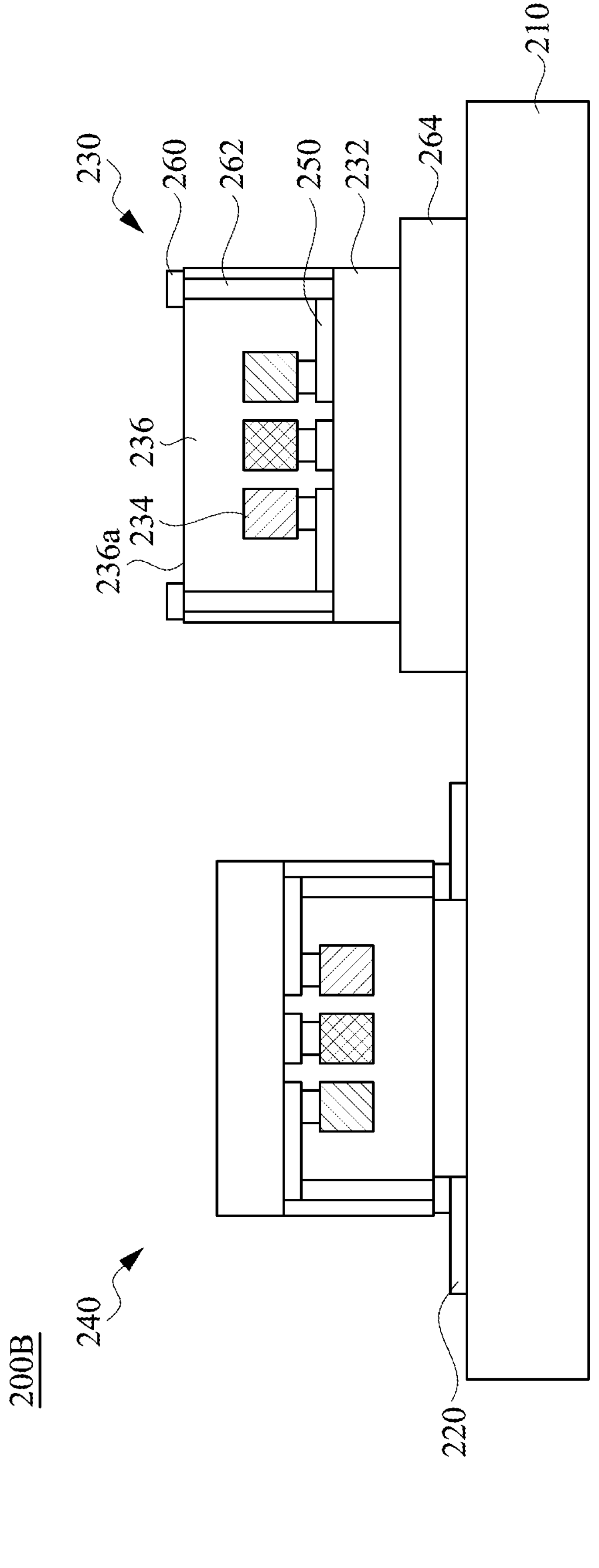

Reference is made to FIG. 5, which is a partially cross-sectional view of the transparent display according to some embodiments of the disclosure. The main difference between the transparent display 200B of FIG. 5 and the transparent display 200A of FIG. 4 is the arrangement of the frontward light-emitting package units 230. Please note that only one frontward light-emitting package unit 230 and one backward light-emitting package unit 240 are illustrated for easy understanding. The transparent display 200B includes a plurality of first connecting pads 250, a plurality of electrode portions 260, a plurality of conductive pillars 262, and an adhesive layer 264. The first connecting pads 250 are disposed on the first surface 232*a* of the micro-substrate 232 of the frontward light-emitting package unit 230 and are coupled to the frontward light-emitting elements 234. The electrode portions 260 are disposed on a top surface 236*a* of the front side sealant 236, in which the top surface 236*a* of the front side sealant 236 is away from the transparent substrate 210. The conductive pillars 262 penetrate the front side sealant 236, to couple the first connecting pads 250 to the electrode portions 260. In some embodiments, the adhesive layer 264 is a transparent adhesive layer. The adhesive layer 264 bonds the micro-substrate 232 to the transparent substrate 210, and the area of the adhesive layer 264 can be equal to or greater than the area of the micro-substrate 232.

The frontward light-emitting package units 230 of the transparent display 200B not only can be controlled by the wiring layer 220, but also can be controlled by an external circuit that is coupled to the electrode portions 260 on the top surface 236*a* of the front side sealant 236. Therefore, the area of the wiring layer 220 can be reduced.

Figure 6:
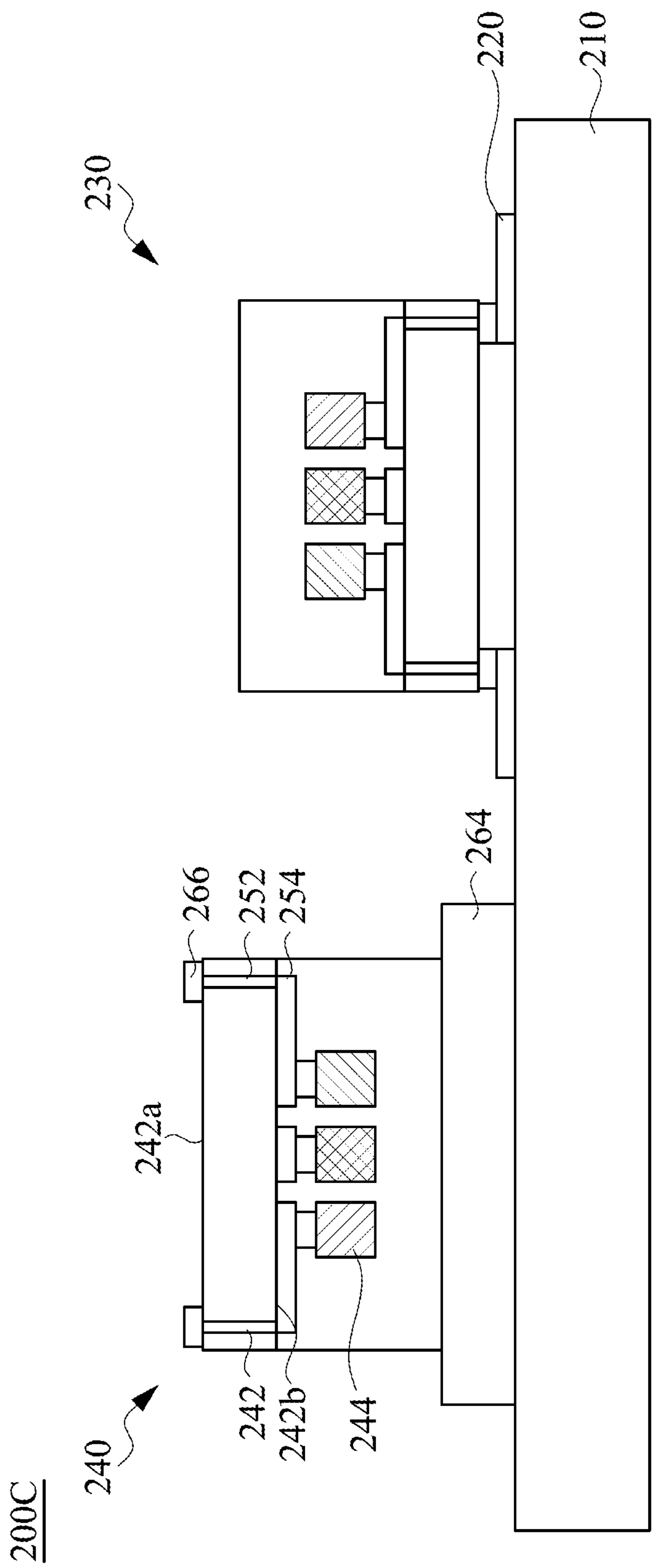

Reference is further made to FIG. 6, which is a partially cross-sectional view of the transparent display according to some embodiments of the disclosure. The main difference between the transparent display 200C of FIG. 6 and the transparent display 200A of FIG. 4 is the arrangement of the backward light-emitting package units 240. Please note that only one frontward light-emitting package unit 230 and one backward light-emitting package unit 240 are illustrated for easy understanding. The transparent display 200C includes a plurality of second connecting pads 254, a plurality of electrode portions 266, a plurality of vias 252, and an adhesive layer 264. The second connecting pads 254 are disposed on the second surface 242*b* of the micro-substrate 242 of the backward light-emitting package unit 240 and are coupled to the backward light-emitting elements 244. The electrode portions 266 are disposed on the first surface 242*a* of the micro-substrate 242. The vias 252 penetrate the micro-substrate 242, to couple the second connecting pads 254 to the electrode portions 266. In some embodiments, the adhesive layer 264 is a transparent adhesive layer. The adhesive layer 264 bonds the micro-substrate 242 to the transparent substrate 210, and the area of the adhesive layer 264 can be equal to or greater than the area of the micro-substrate 242.

The backward light-emitting package units 240 of the transparent display 200C not only can be controlled by the wiring layer 220, but also can be controlled by an external circuit that is coupled to the electrode portions 266 on the first surface 242*a* of the micro-substrate 242. Therefore, the area of the wiring layer 220 can be reduced.

Figure 7:
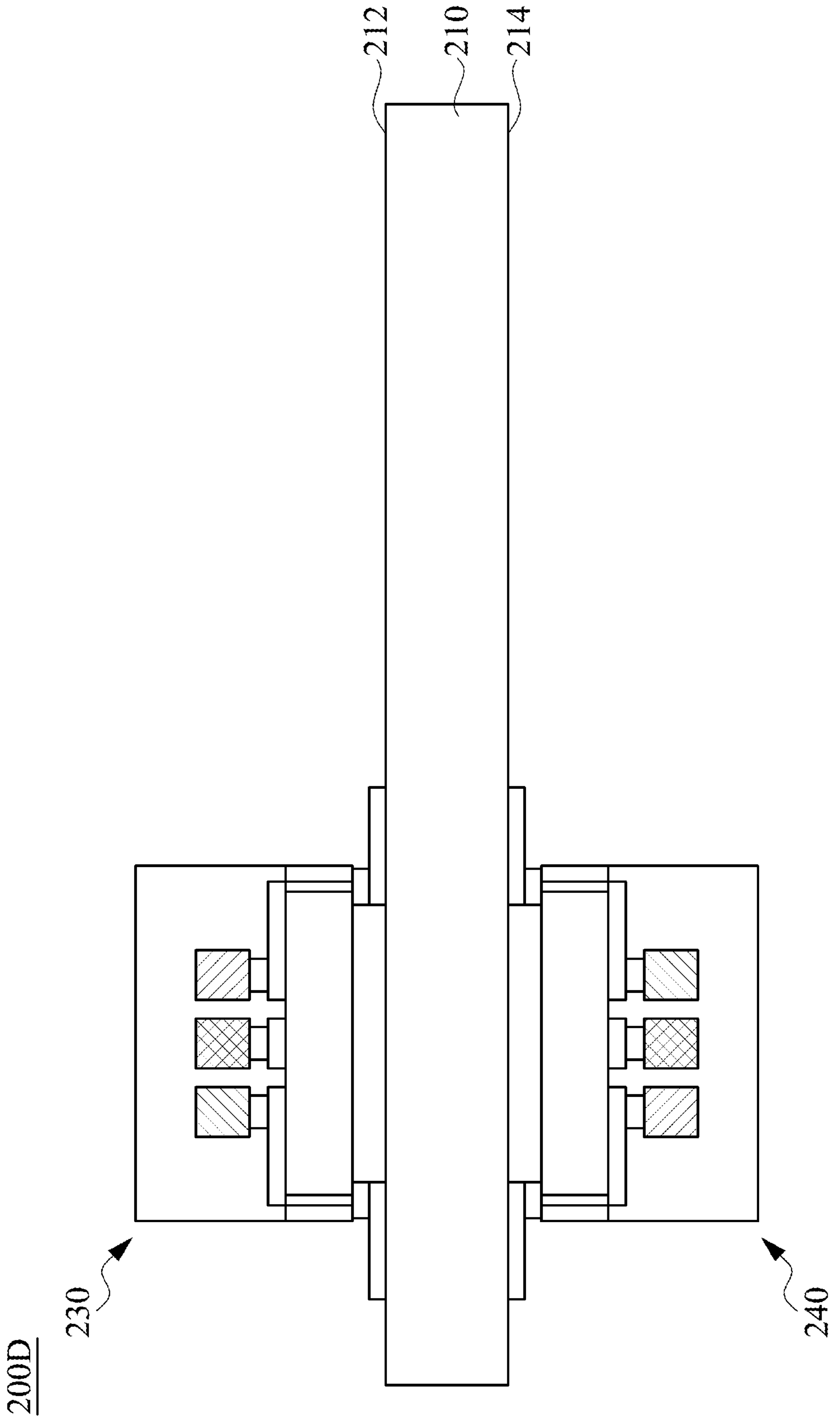

Reference is made to FIG. 7, which is a partially cross-sectional view of the transparent display according to some embodiments of the disclosure. In some embodiments, the transparent substrate 210 includes a first surface 212 and a second surface 214 opposite to each other. The frontward light-emitting package units 230 are disposed on the first surface 212 of the transparent substrate 210, and the backward light-emitting package units 240 are disposed on the second surface 214 of the transparent substrate 210. Please note that only one frontward light-emitting package unit 230 and one backward light-emitting package unit 240 are illustrated for easy understanding. In some embodiments, the frontward light-emitting package units 230 and the backward light-emitting package units 240 on the opposite first surface 212 and second surface 214 of the transparent substrate 210 are overlapped, to provide the transparent display 200D sufficient transmittance. In some other embodiments, the frontward light-emitting package units 230 and the backward light-emitting package units 240 on the opposite first surface 212 and second surface 214 of the transparent substrate 210 are not overlapped, but still provide the transparent display 200D sufficient transmittance by proper arrangement.

The aforementioned frontward light-emitting package units 230 and the backward light-emitting package units 240 can be made and packaged and then be electrical tested. After the frontward light-emitting package units 230 and the backward light-emitting package units 240 pass the electrical test, the frontward light-emitting package units 230 and the backward light-emitting package units 240 can be mass transferred to the transparent substrate 210 for assembling. Because the frontward light-emitting package units 230 and the backward light-emitting package units 240 are assembled to the transparent substrate 210 after passing the electrical test, the yield of the transparent displays 200A, 200B, 200C, 200D can be improved, and the defects or rework issues can be reduced accordingly.

In this disclosure, the transparent displays can be fabricated including using the packaged and electrical tested light-emitting package units, some other designs, such as using light-emitting elements with a light-shielding layer, can also achieve requirements of personal privacy and double-side display function.

Figure 8A:
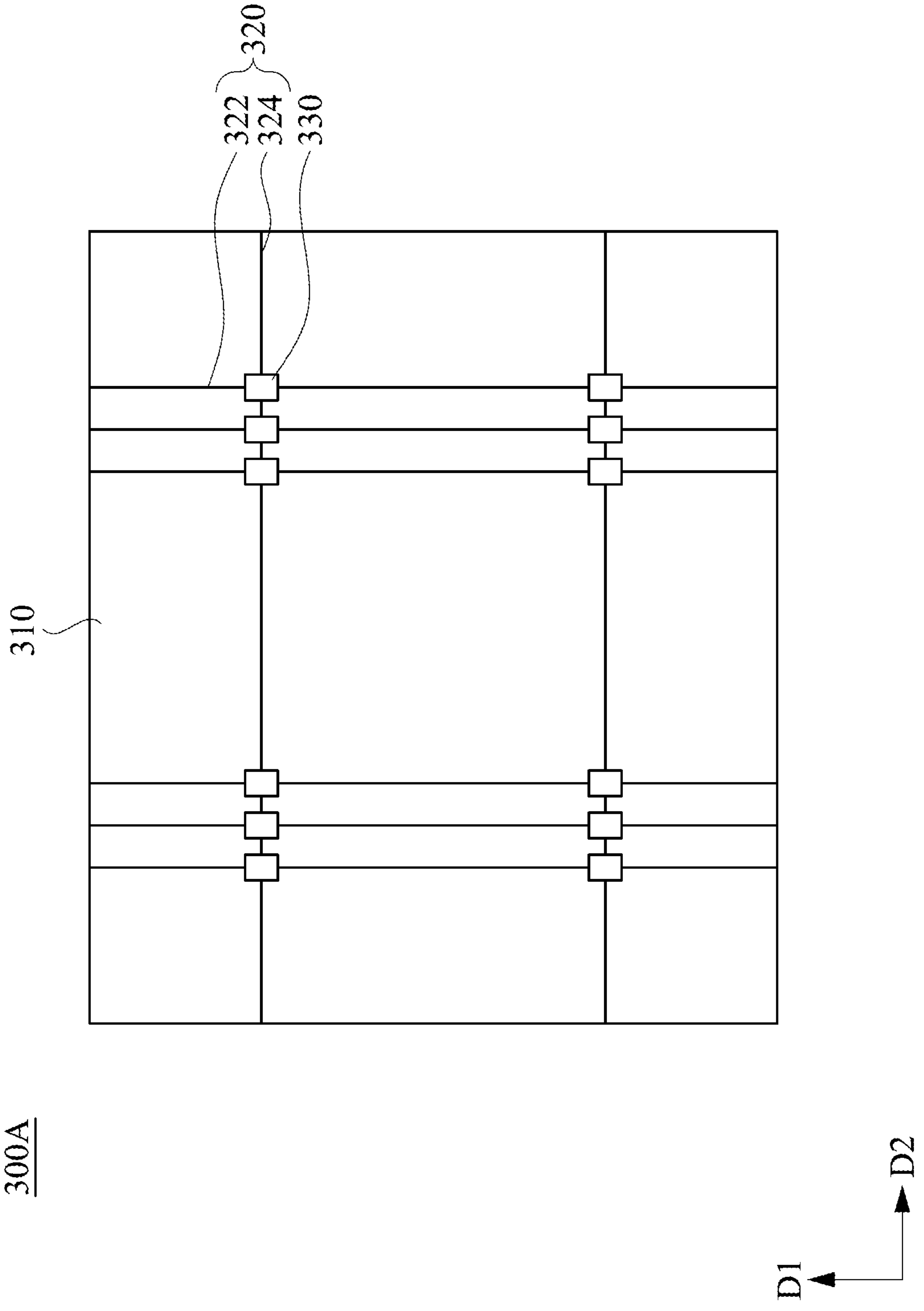
FIG. 8A and FIG. 8B are a top view and a cross-sectional view of the transparent display according to some other embodiments of the disclosure.
Figure 8B:
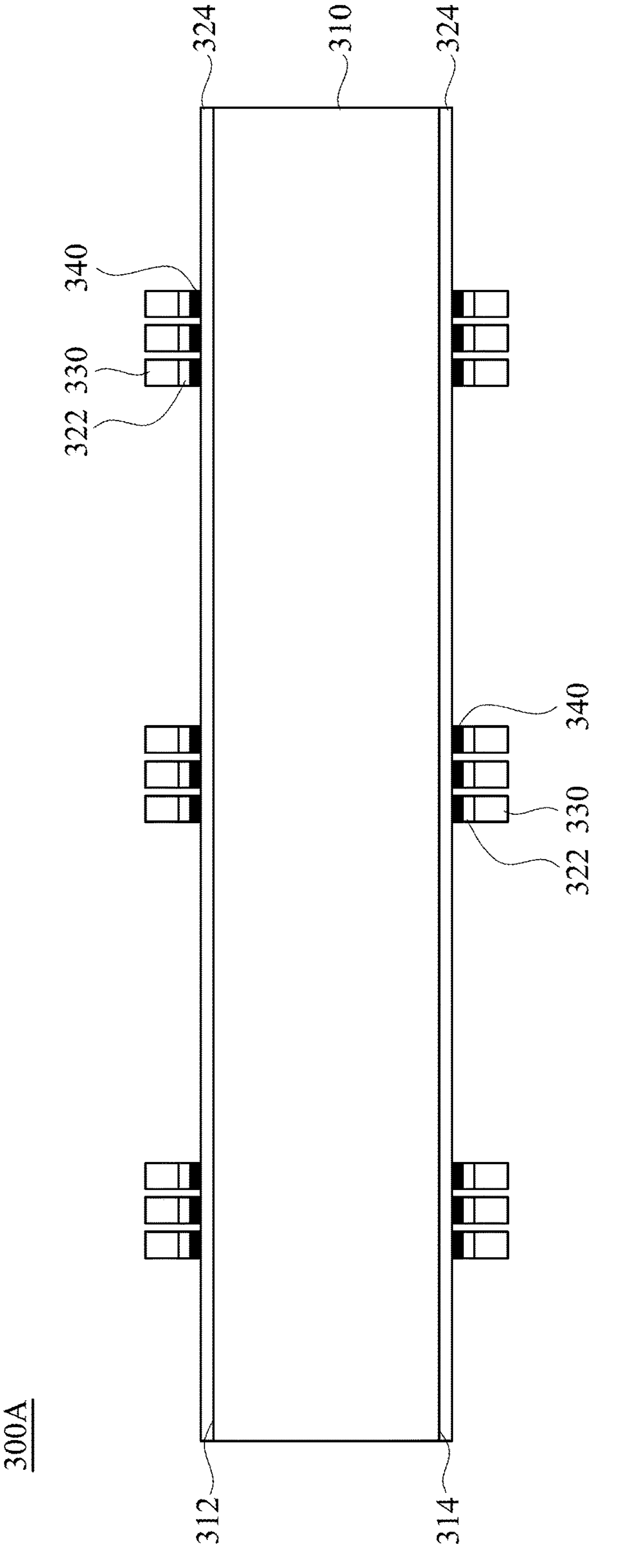

Reference is made to FIG. 8A and FIG. 8B, which are a top view and a cross-sectional view of the transparent display according to some other embodiments of the disclosure. The transparent display 300A includes a transparent substrate 310, two wiring layers 320, a plurality of light-emitting elements 330, and a plurality of light-shielding layers 340. The transparent substrate 310 has a first surface 312 and a second surface 314 opposite to each other. The wiring layers 320 are disposed on the first surface 312 and the second surface 314 of the transparent substrate 310, respectively. The light-emitting elements 330 are disposed on the wiring layers 320. The light-shielding layers 340 are disposed between the light-emitting elements 330 and the transparent substrate 310.

More particularly, the light-emitting elements 330 can be LEDs such as lateral-type LEDs. The electrodes of the light-emitting elements 330 are at the same side of the light-emitting elements 330, and the light is emitted from another side. Each of the wiring layers 320 includes a plurality of first lines 322 extending in a first direction D1 and a plurality of second lines 324 extending in a second direction D2, in which the first direction D1 can be perpendicular to the second direction D2. The first lines 322 and the second lines 324 are coupled to the electrodes of the light-emitting elements 330, respectively.

In some embodiments, the first lines 322 and the second lines 324 are straight lines without branches, and the light-emitting elements 330 are disposed at the cross points of the first lines 322 and the second lines 324. In some embodiments, the light-shielding layers 340 are disposed between the first lines 322 and the second lines 324, to block the light emitted from the light-emitting elements 330 toward the transparent substrate 310 and to electrically isolate the first lines 322 from the second lines 324.

In some embodiments, the light-shielding layers 340 are disposed corresponding to the light-emitting elements 330, and the light-shielding layers 340 are spaced apart from each other. The area of each of the light-shielding layers 340 is equal to or greater than the area of each of light-emitting elements 330, such that the overall transmittance of the transparent display 300A can be greater than 30% while using the light-emitting elements 330 to block the light. In some embodiments, the light-emitting elements 330 on the first surface 312 of the transparent substrate 310 align with the light-emitting elements 330 on the second surface 314 of the transparent substrate 310. The driving IC to control the light-emitting elements 330 can be disposed on the transparent substrate 310 or disposed on an external circuit board though an adapter circuit board.

Figure 9A:
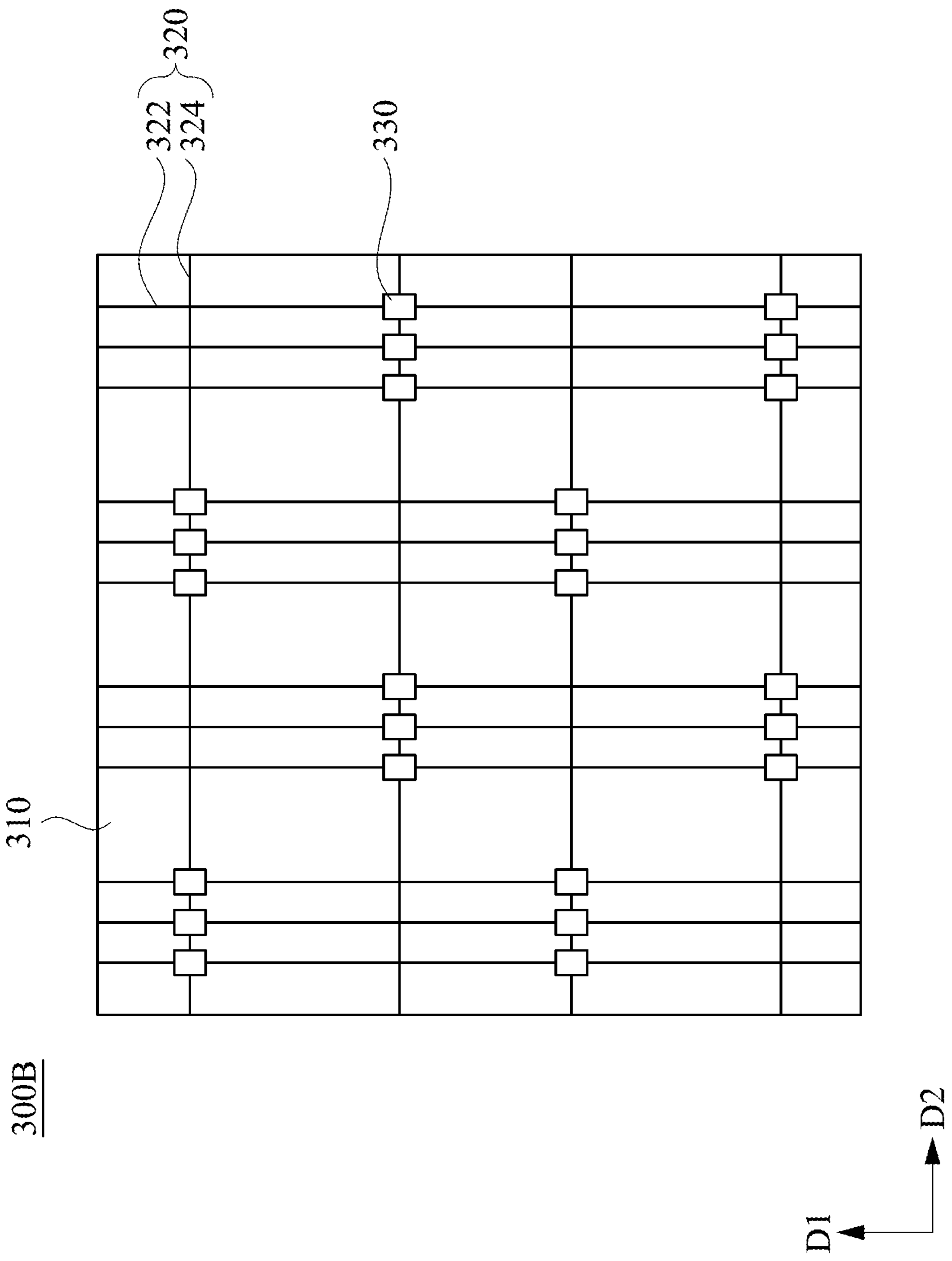
FIG. 9A and FIG. 9B are a top view and a cross-sectional view of the transparent display according to some other embodiments of the disclosure.
Figure 9B:
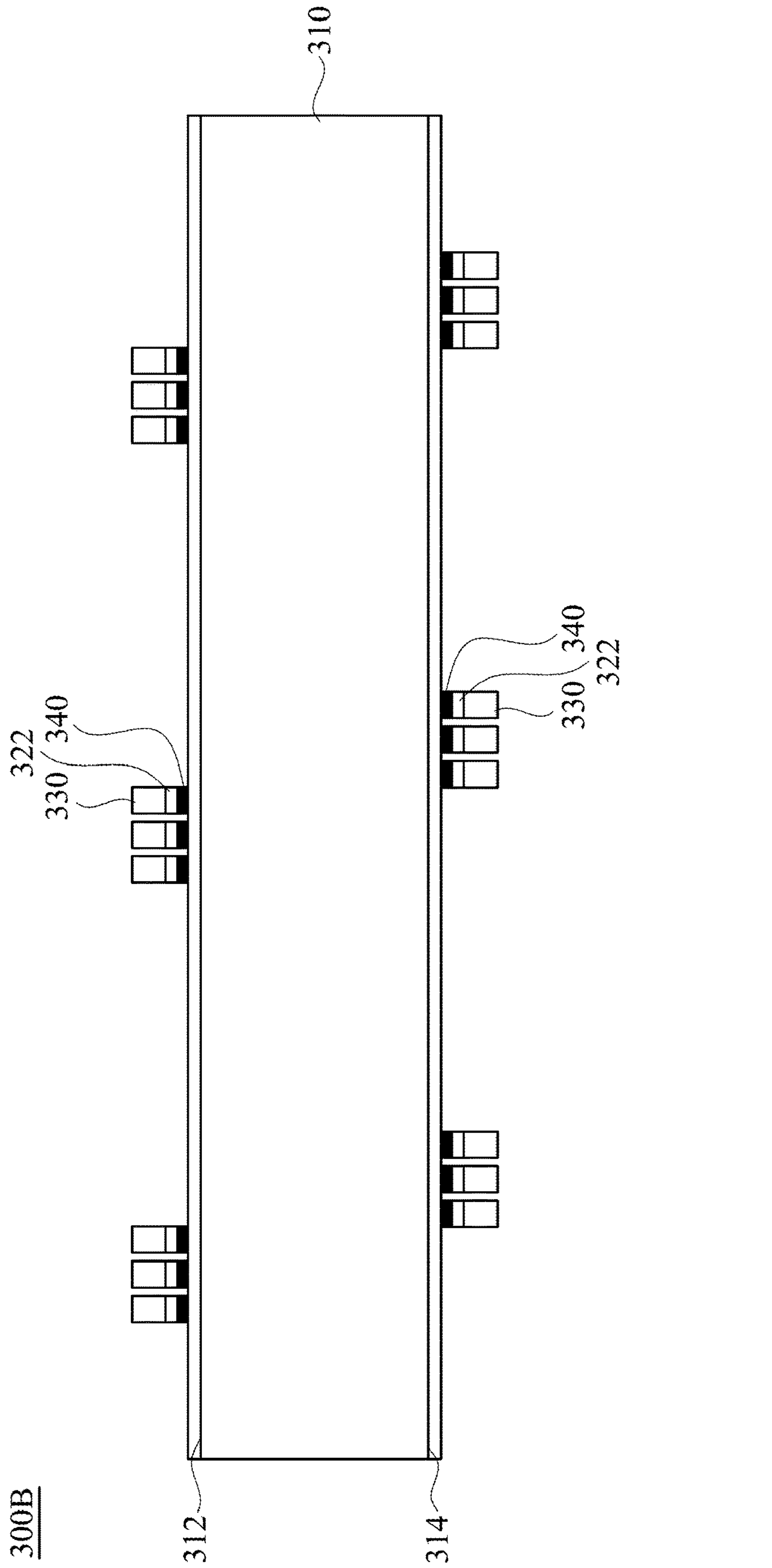

Reference is made to FIG. 9A and FIG. 9B, which are a top view and a cross-sectional view of the transparent display according to some other embodiments of the disclosure. The main difference between the transparent display 300B and the transparent display 300A is that the light-emitting elements 330 on the first surface 312 of the transparent substrate 310 do not align with the light-emitting elements 330 on the second surface 314 of the transparent substrate 310. Namely, the light-emitting elements 330 on the first surface 312 of the transparent substrate 310 and the light-emitting elements 330 on the second surface 314 of the transparent substrate 310 are misaligned arranged.

Figure 10A:
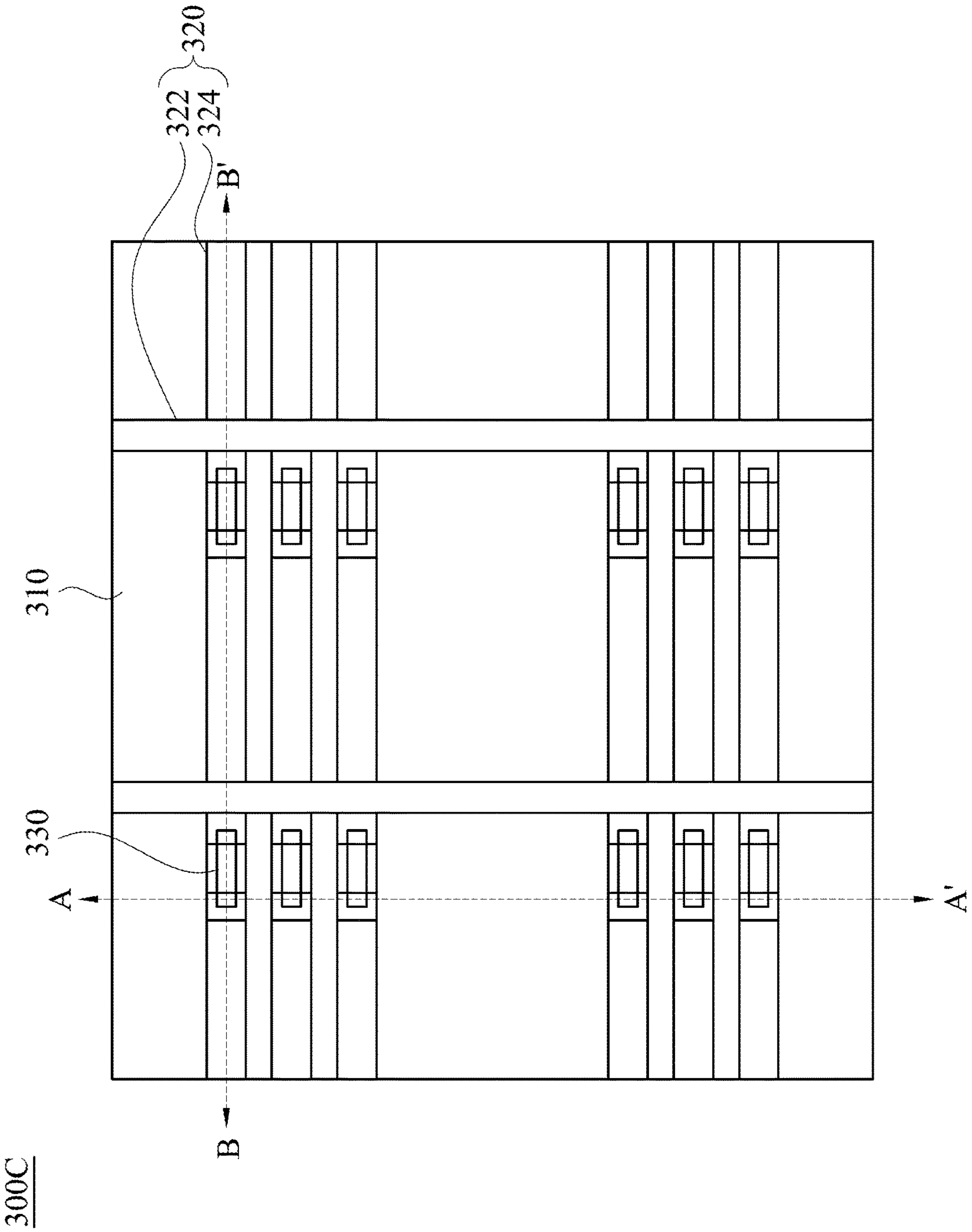
FIG. 10A is a top view of the transparent display according to some embodiments of the disclosure.
Figure 10B:
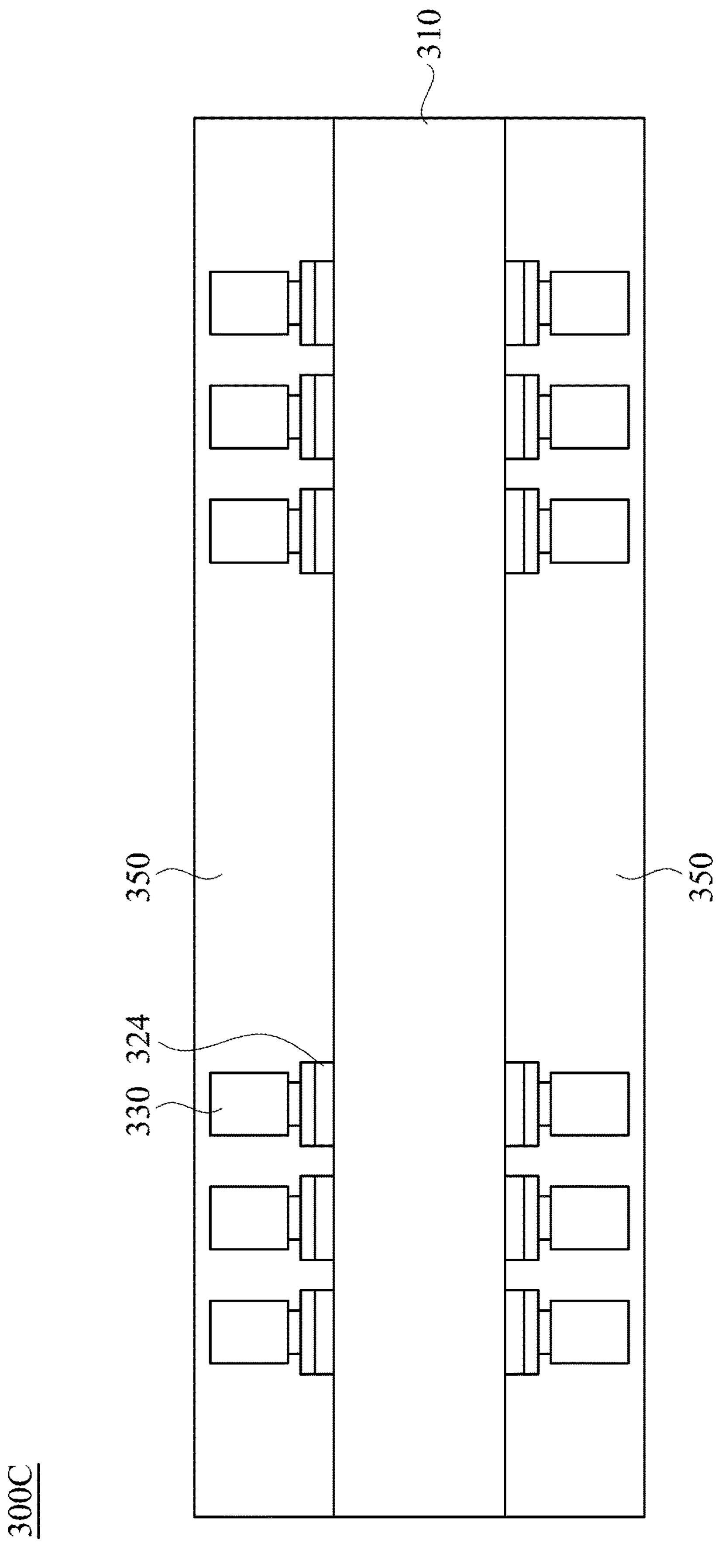
FIG. 10B is a cross-sectional view taken along line A-A' of FIG. 10A.
Figure 10C:
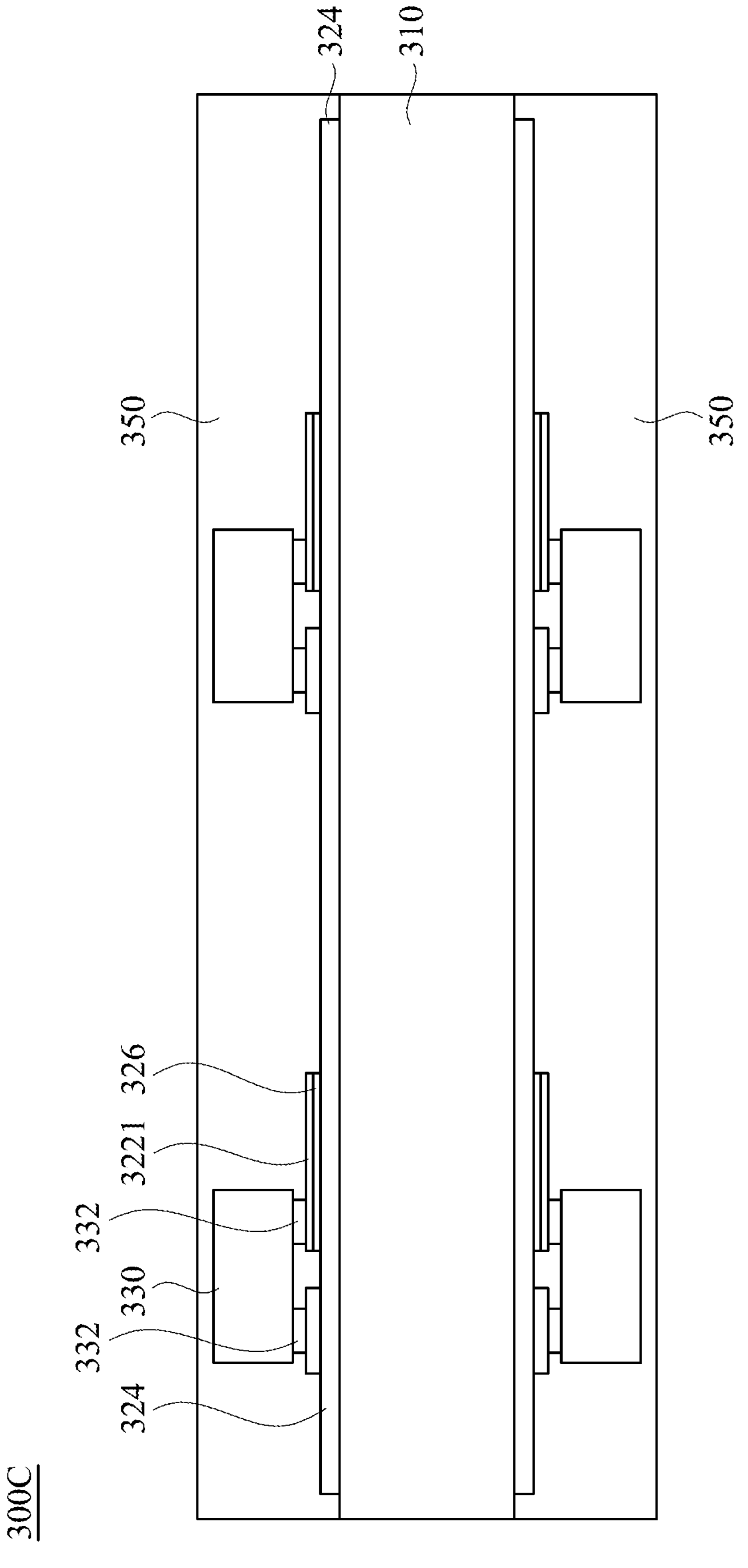
FIG. 10C is a cross-sectional view taken along line B-B' of FIG. 10A.

Reference is made to FIG. 10A, FIG. 10B, and FIG. 10C. FIG. 10A is a top view of the transparent display according to some embodiments of the disclosure. FIG. 10B is a cross-sectional view taken along line A-A' of FIG. 10A. FIG. 10C is a cross-sectional view taken along line B-B' of FIG. 10A. The main difference between the transparent display 300C and the transparent display 300A is that the first lines 322 and the second lines 324 are metal lines and serve as light-shielding components. The light emitted by the light-emitting elements 330 toward the transparent substrate 310 is blocked by the first lines 322 and the second lines 324.

More particularly, a plurality of insulating islands 326 are disposed at the cross points between the first lines 322 and the second lines 324 to electrically isolate the first lines 322 from the second lines 324. The first lines 322 can optionally include branches 3221, and the two electrodes of each of the light-emitting elements 330 are coupled to the branch 3221 (if exists) of the corresponding first line 322 and the corresponding second line 324, respectively.

Additionally, the transparent display 300C further includes an optical passivation layer 350. The light-emitting elements 330 are disposed in the optical passivation layer 350. In some embodiments, the optical passivation layer 350 can be dielectric material having a light transmittance greater than 90%.

Figure 11A:
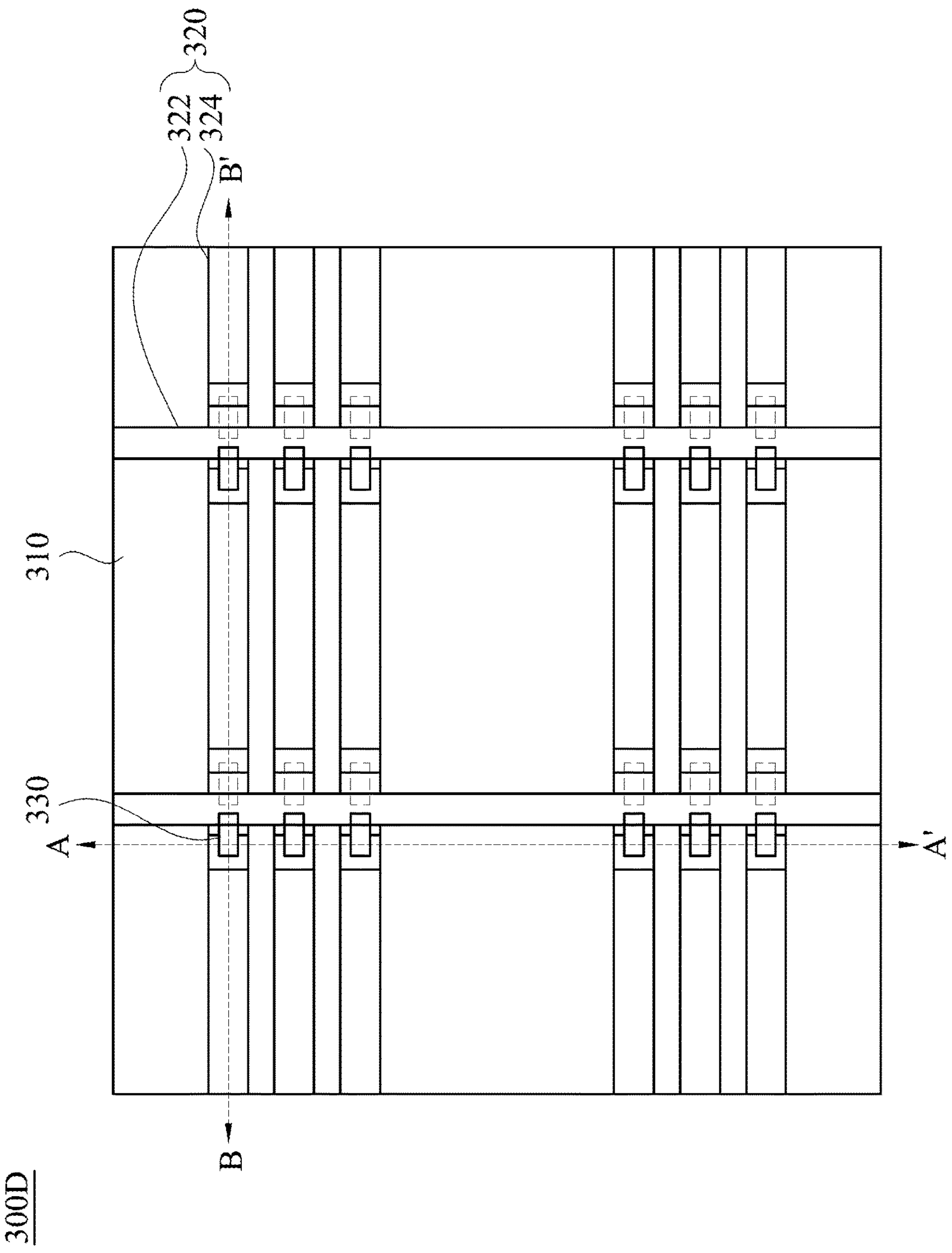
FIG. 11A is a top view of the transparent display according to some embodiments of the disclosure.
Figure 11B:
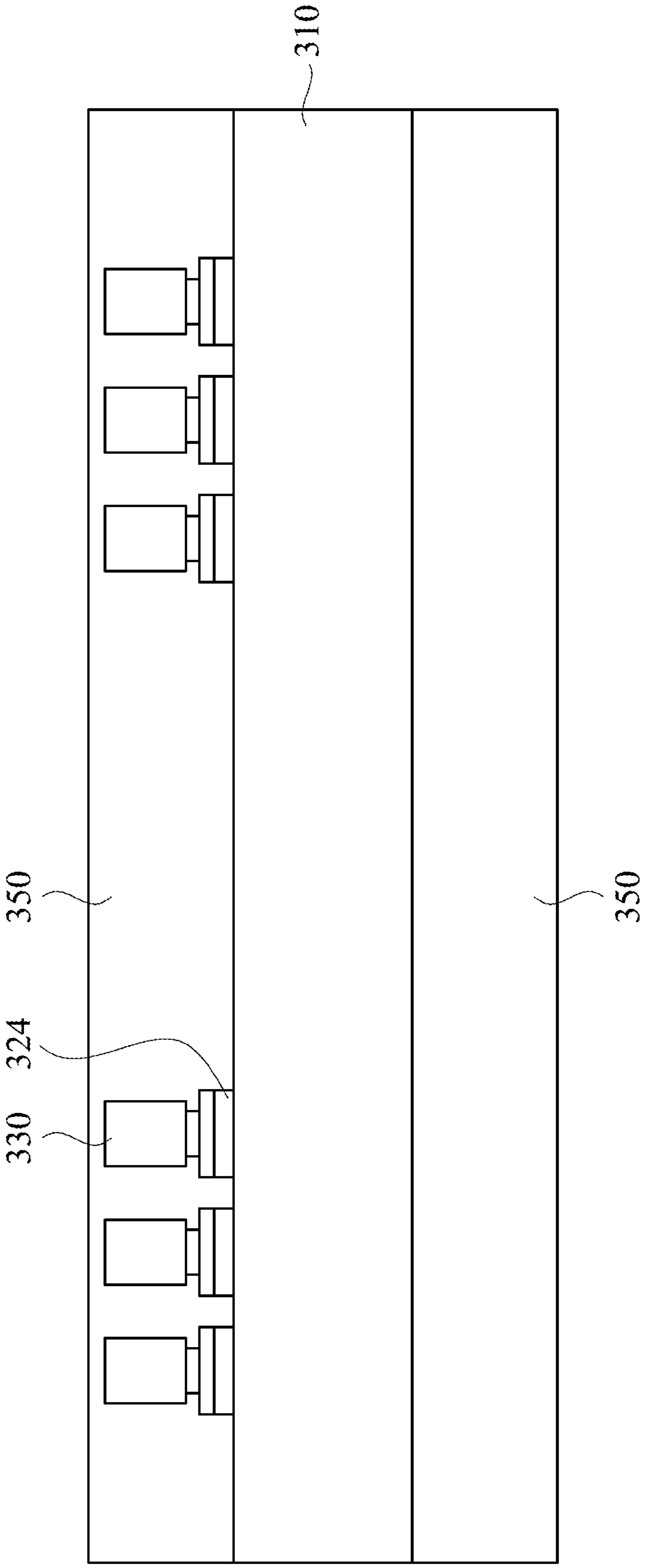
FIG. 11B is a cross-sectional view taken along line A-A' of FIG. 11A.
Figure 11C:
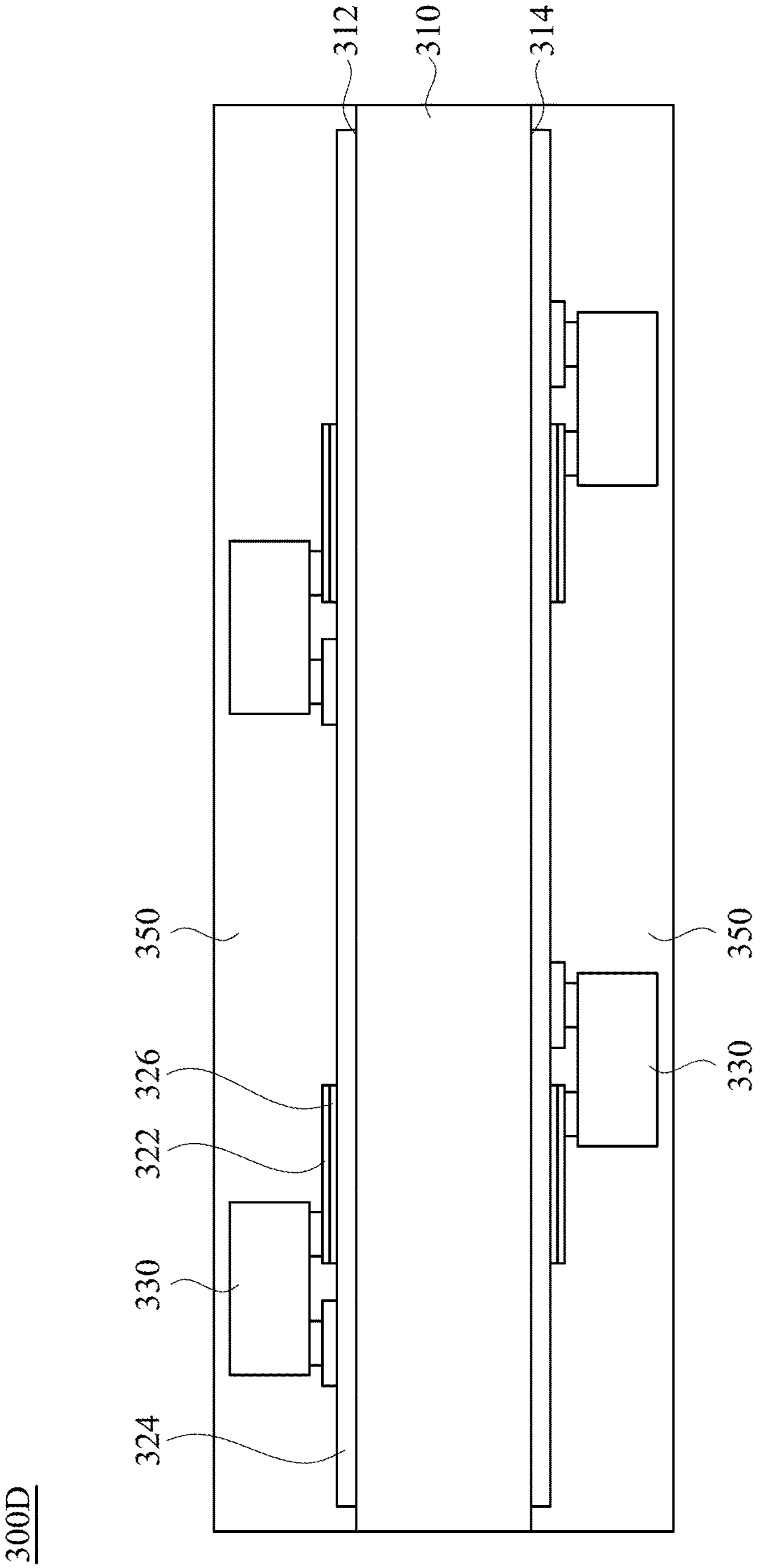
FIG. 11C is a cross-sectional view taken along line B-B' of FIG. 11A.

Reference is made to FIG. 11A, FIG. 11B, and FIG. 11C. FIG. 11A is a top view of the transparent display according to some embodiments of the disclosure. FIG. 11B is a cross-sectional view taken along line A-A' of FIG. 11A. FIG. 11C is a cross-sectional view taken along line B-B' of FIG. 11A. The main difference between the transparent display 300D and the transparent display 300C is that the light-emitting elements 330 on the first surface 312 of the transparent substrate 310 do not align with the light-emitting elements 330 on the second surface 314 of the transparent substrate 310. Namely, the light-emitting elements 330 on the first surface 312 of the transparent substrate 310 and the light-emitting elements 330 on the second surface 314 of the transparent substrate 310 are misaligned arranged.

Figure 12A:
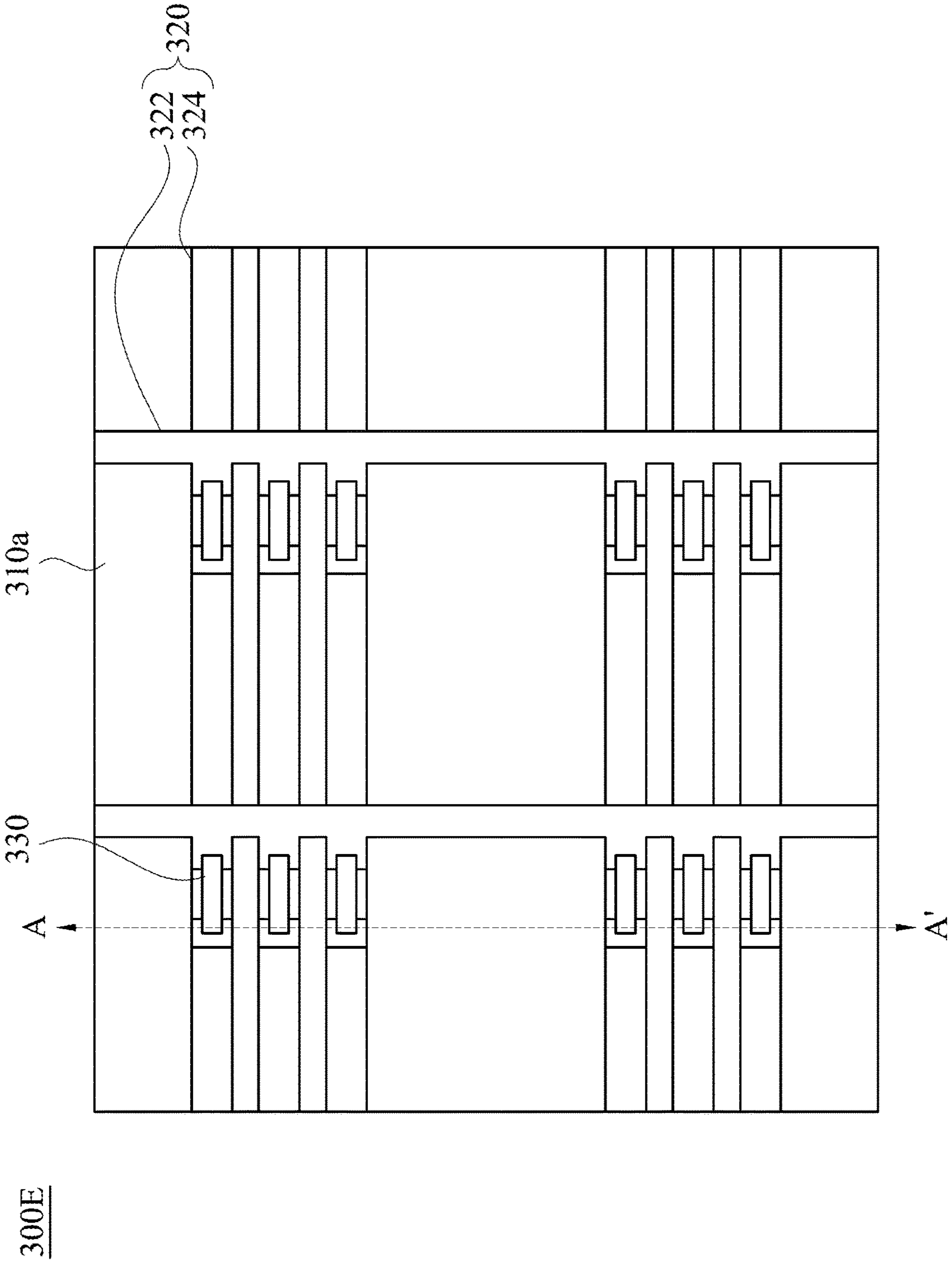
FIG. 12A is a top view of the transparent display according to some embodiments of the disclosure.
Figure 12B:
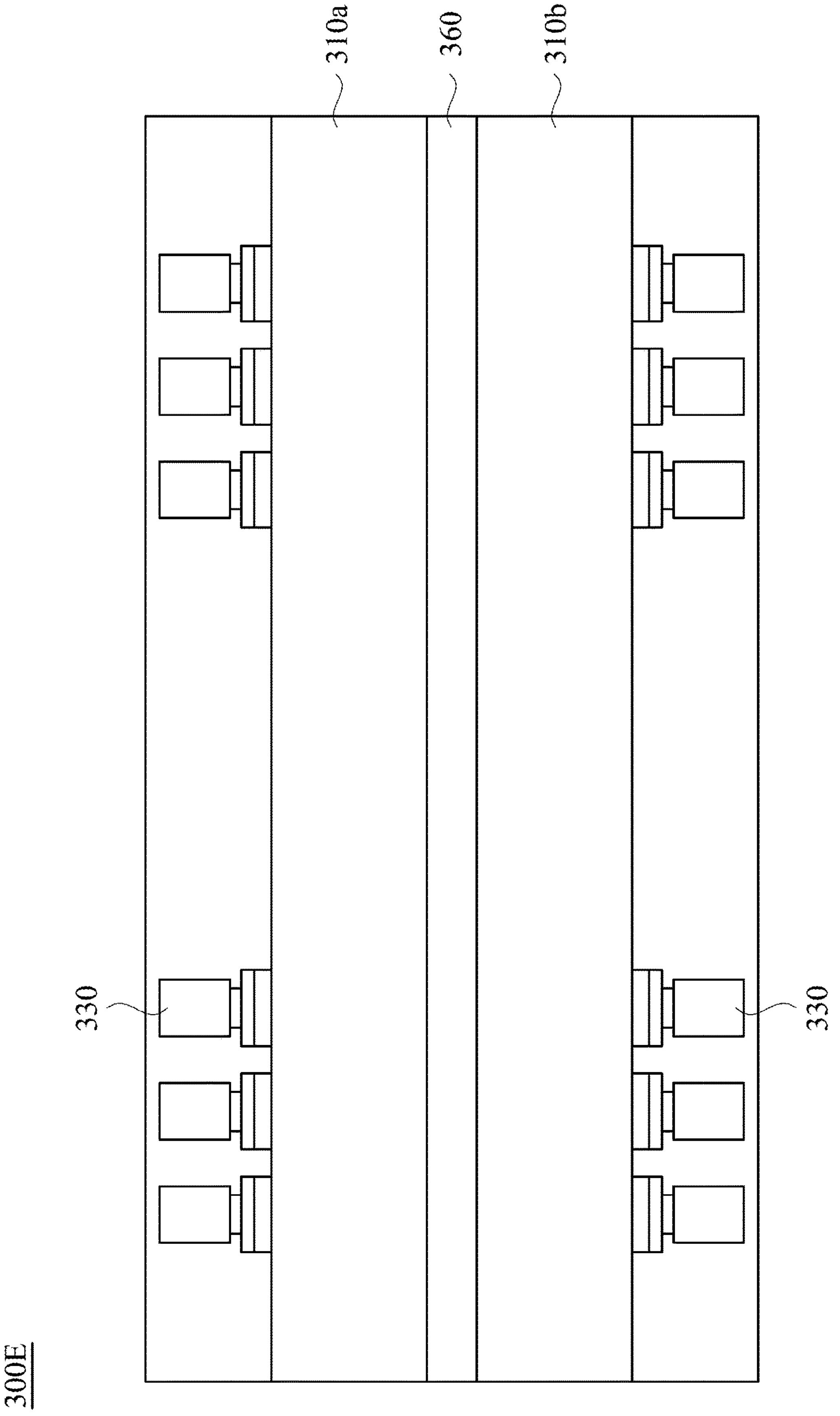
FIG. 12B is a cross-sectional view taken along line A-A' of FIG. 12A.

Reference is made to FIG. 12A and FIG. 12B. FIG. 12A is a top view of the transparent display according to some embodiments of the disclosure. FIG. 12B is a cross-sectional view taken along line A-A' of FIG. 12A. In some embodiments, the transparent display 300E includes two transparent substrates 310*a*, 310*b*. The light-emitting elements 330 at the front side and the light-emitting elements 330 at the back side are respectively disposed on the surfaces of the transparent substrates 310*a*, 310*b*. The transparent substrates 310*a*, 310*b* are bonded by transparent adhesive layer 360. The transparent display 300E can use the wiring layers 320 which are made of metal material to block the light emitted to the transparent substrates 310*a*, 310*b*, or the transparent display 300E can use the light-shielding layers 340 (as shown in FIG. 8B) to block the light emitted to the transparent substrates 310*a*, 310*b*. The light-emitting elements 330 on the front side of the transparent substrates 310*a*, 310*b* and the light-emitting elements 330 on the back side of the transparent substrates 310*a*, 310*b* can be aligned or misaligned.

It will be apparent to those skilled in the art that various modifications and variations can be made to the structure of the present disclosure without departing from the scope or spirit of the disclosure. In view of the foregoing, it is intended that the present disclosure cover modifications and variations of this invention provided they fall within the scope of the following claims and their equivalents.

What is claimed is:

1. A transparent display comprising:
- a transparent substrate;
- a wiring layer disposed on a surface of the transparent substrate;
- a plurality of light-emitting package units, each of the light-emitting package units comprising:
  - a micro-substrate having a first surface facing away from the transparent substrate and a second surface facing the transparent substrate;
  - a plurality of frontward light-emitting elements disposed on the first surface of the micro-substrate, wherein the micro-substrate is configured to block a light from the frontward light-emitting elements toward the transparent substrate;
  - a plurality of backward light-emitting elements disposed on the second surface of the micro-substrate; and
  - a sealant covering the micro-substrate, the frontward light-emitting elements, and the backward light-emitting elements; and
- a plurality of connecting elements electrically connecting the light-emitting package units to the wiring layer, respectively.

2. The transparent display of claim 1, wherein the connecting elements comprise:
- a plurality of first connecting pads disposed on the first surface of the micro-substrate of each of light-emitting package units and coupled to the frontward light-emitting elements;
- a plurality of vias penetrating the micro-substrate of each of light-emitting package units and coupled to the first connecting pads; and
- a plurality of conductive pillars disposed in the sealant of each of light-emitting package units to couple the vias to the wiring layer on the transparent substrate.

3. The transparent display of claim 1, wherein the connecting elements comprise:
- a plurality of second connecting pads disposed on the second surface of the micro-substrate of each of light-emitting package units and coupled to the backward light-emitting elements; and a plurality of conductive pillars disposed in the sealant of each of light-emitting package units to couple the second connecting pads to the wiring layer on the transparent substrate.

4. The transparent display of claim 1, wherein the light-emitting package units are spaced from each other, and an overall transmittance of the transparent display is greater than 30%.

5. The transparent display of claim 1, wherein a light transmittance of the micro-substrate is equal to or less than 5%.

6. The transparent display of claim 1, wherein the light-emitting package units are all disposed on the surface of the transparent substrate.

7. The transparent display of claim 1, wherein the micro-substrate is a silicon substrate, a ceramic substrate, or a printed circuit board.

8. The transparent display of claim 1, wherein each of the light-emitting package units comprises a driving IC disposed on the micro-substrate, and the driving IC is coupled to the frontward light-emitting elements, the backward light-emitting elements, and the wiring layer.

9. The transparent display of claim 1, wherein the sealant of each of the light-emitting package units comprises:

a first sealing portion disposed on the first surface of the micro-substrate; and a second sealing portion disposed on the second surface of the micro-substrate, wherein a light transmittance of the first sealing portion is different from a light transmittance of the second sealing portion.

10. The transparent display of claim 9, wherein a thickness of the first sealing portion is different from a thickness of the second sealing portion.

11. The transparent display of claim 9, wherein a material of the first sealing portion is different from a material of the second sealing portion.

* * * * *